United States Patent
Lou et al.

(10) Patent No.: US 7,092,836 B2
(45) Date of Patent: Aug. 15, 2006

(54) METHOD FOR LOCATING WIRING SWAP IN A HI-FIX STRUCTURE OF A SIMULTANEOUS MULTI-ELECTRONIC DEVICE TEST SYSTEM

(75) Inventors: Hsiao-Chi Lou, Hsinchu (TW); Ween-Chen Lu, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 134 days.

(21) Appl. No.: 10/652,954

(22) Filed: Aug. 28, 2003

(65) Prior Publication Data

US 2004/0167728 A1 Aug. 26, 2004

(30) Foreign Application Priority Data

Feb. 25, 2003 (TW) .............................. 92103954 A

(51) Int. Cl.
*G01R 27/28* (2006.01)
*G01R 31/00* (2006.01)

(52) U.S. Cl. .................................................. 702/117

(58) Field of Classification Search ............... 702/117, 702/108, 118; 324/754–765, 158.1, 500, 324/537

See application file for complete search history.

(56) References Cited

U.S. PATENT DOCUMENTS

| | | | | |
|---|---|---|---|---|
| 5,481,203 A | * | 1/1996 | Appold | 324/755 |
| 5,742,168 A | * | 4/1998 | Kiyokawa et al. | 324/754 |
| 6,198,273 B1 | * | 3/2001 | Onishi et al. | 324/158.1 |
| 6,204,679 B1 | * | 3/2001 | Gray, III | 324/760 |
| 6,304,053 B1 | * | 10/2001 | Johnson | 318/771 |
| 6,407,566 B1 | * | 6/2002 | Brunelle et al. | 324/758 |
| 6,483,317 B1 | * | 11/2002 | Floro et al. | 324/537 |
| 6,772,380 B1 | * | 11/2002 | Floro et al. | 714/724 |
| 6,774,659 B1 | * | 8/2004 | Chiang | 324/765 |
| 2002/0144096 A1 | * | 10/2002 | Burch | 712/218 |
| 2003/0023802 A1 | * | 1/2003 | Ho et al. | 710/302 |
| 2003/0035400 A1 | * | 2/2003 | Adler et al. | 370/338 |
| 2003/0080726 A1 | * | 5/2003 | Kroog et al. | 324/158.1 |
| 2003/0179005 A1 | * | 9/2003 | Buczkowski et al. | 324/754 |
| 2004/0181718 A1 | * | 9/2004 | Long | 714/724 |
| 2004/0190331 A1 | * | 9/2004 | Ross et al. | 365/154 |

OTHER PUBLICATIONS

Lawicel Soft and Hardware uCAN.cpu.505, 2002, pp. 1-13.*
candip.com, "What can I do with CANDIP/505 ?", Sep. 13, 2000, pp. 1-2.*
ST Microelectronics, M28010, 1 Mbit Parallel EEPROM With Software Data Protection,Jan. 1999, pp. 1-22.*
ST Microelectronics, M28256, 256 Kbit Parallel EEPROM With Software Data Protection,Jan. 1999, pp. 1-22.*

* cited by examiner

*Primary Examiner*—Michael Nghiem
*Assistant Examiner*—Demetrius Pretlow

(57) ABSTRACT

A method for locating wiring swap in a hi-fix structure of a simultaneous multi-electronic device test system is introduced to screen the complicated wiring state of the hi-fix structure and to pinpoint the wiring swap thereinside as well. The hi-fix structure has at least S socket slots for testing electronic devices which each of the electronic devices has at least R leads. The present method, firstly, is to prepare R test unit sets which each of the test unit set includes S identical lead-off elements. Then, all R test unit sets are tested, in order, on the hi-fix structure and the respective test results are recorded. Finally, by analyzing the test results, the wiring swap inside the hi-fix structure can be accurately located.

12 Claims, 5 Drawing Sheets

METHOD FOR LOCATING WIRING SWAP IN A HI-FIX STRUCTURE OF A SIMULTANEOUS MULTI-ELECTRONIC DEVICE TEST SYSTEM

CROSS-REFERENCES TO RELATED APPLICATIONS

This application claims priority from R.O.C. Patent Application No. 092103954, filed Feb. 25, 2003, the entire disclosure of which is incorporated herein by reference.

BACKGROUND OF THE INVENTION

The invention relates to a method for locating wiring swap in a hi-fix structure of a simultaneous multi-electronic device test system, and more particularly to a rapid and whole-scale test method which utilizes standard sets of test devices to screen and further locate possible wiring swap in the hi-fix structure.

In the industry of testing electronic devices, one of efficient methods is the one which applies a simultaneous multi-electronic device test system to carry out target testing automatically simultaneously upon batches of electronic devices. Such a simultaneous multi-electronic device test system can be usually seen as a testing dynamic test handler, a memory test system, a silicon-on-chip test system, a liquid crystal display driver test system, a radio frequency integrated circuit test system, or the like.

In any test system mentioned above, the test system generally has a control unit to operate several test heads, and each test head further includes a hi-fix structure. The hi-fix structure includes a plurality of socket slots arranged typically in an array pattern. Each socket slot is used to receive or mount an electronic device for testing, or a so called device under test (DUT).

Referring to FIG. 1, a typical test head of a conventional simultaneous multi-electronic device test system is shown. In the test head 1, a performance board 3, a hi-fix structure 5 and a plurality of socket slot 51 are constructed in a bottom-to-top layer order. Generally speaking, array patterns for arranging the socket slots 51 on the hi-fix structure 5 vary from manufacturer to manufacturer and also from system to system. As shown in FIG. 2, a top view of a typical array pattern for the socket slots 51 of the hi-fix structure 5 is schematically illustrated. In the N×M array pattern, a total number of N×M socket slots 51, labeled from TS[1] to TS[NM], are shown. While in testing, N×M electronic devices (not shown in the figure) are automatically and simultaneously transferred onto or removed from the hi-fix structure 5, in which each electronic device is targeted to a respective socket slot 51.

Referring now to FIG. 3, a cross-sectional view along line a—a of FIG. 1 is shown. It is seen that a socket board 50 for receiving leads of electronic device is sandwiched between the socket slot 51 and the hi-fix structure 5. Also, a number of connecting cables 53 for engaging with respective leads of the electronic device are located to extend from the socket board 50 to the performance board 3.

Electric conjunction among the electronic device 10 having P leads, the hi-fix structure 5 and the performance board 3 is schematically shown in FIG. 4. Each connecting cable 53 inside the hi-fix structure 5 is applied to connect electrically a respective one of the leads labeled from L(1) to L(P) and extending from the lead side 101 of the electronic device 10 to a respective predetermined location on the performance board 3. In FIG. 4, normal or correct wiring of the connecting cables 53 among the electronic devices 10, the hi-fix structure 5 and the performance board 3 are illustrated by the dashed lines.

In case that the wiring in the hi-fix structure cannot present a normal state as described in FIG. 4, the testing performed by the test head having the hi-fix structure would be definitely incorrect. Practically, possibility of mis-wiring or, say, wiring swap in the hi-fix structure is not rare, and the existence of such a wiring swap does cause real and not-easy-to-be-detected problems in the application of the simultaneous multi-electronic device test system. Referring now to FIG. 5, a comparison to the FIG. 4 is illustrated to present a typical wiring swap in the hi-fix structure 5. As shown, cables 53' represented by solid lines (correct wiring by dashed lines also presented for reference purpose) inside the hi-fix structure 5 corresponding to the leads L(k) and L(1) of the electronic device 10 are swapped. It is obvious that the hi-fix structure 5 having the wiring swap in FIG. 5 will lead to inaccurate testing results.

In some cases, fortunately, the wiring swap in the hi-fix structure can be detected and fixed by the manufacturer during the quality control session, or can be detected during the pilot run in the application field. The wiring swap in the hi-fix structure exists in the simultaneous multi-electronic device test system during its assembly stage in the manufacturer, but an indication of the wiring swap problem usually rises at the moment when a field engineer questions the test results after a substantial period of usage. Under such a situation, the damage caused by the test system having the wiring swap problem may already be significant.

In the art, in case that a wiring swap is encountered, substantial time and labor are usually required for locating and further correcting the swapped cables. Generally, to avoid time wasted for the shipment between the user end and the manufacturer, the maintenance is usually carried out in the application field, i.e., at the user end. The maintenance targeted to a possible wiring swap includes shutting-down of the test system, disassembling of the test head as well as the hi-fix structure, the connection testing cable by cable, re-assembling, and a final test run to examine if there is another wiring swap. Notably, the maintenance described above is inefficient.

Empirically, wiring swap in the hi-fix structure usually cannot be resolved in a routine or standard maintenance. The reason is that various cables exist in a limited space inside the hi-fix structure, which significantly complicates the pinpointing of all swapped cables. For example, in a hi-fix structure with N×M socket slots, the number of connecting cables inside the hi-fix structure would be N×M×P if each socket slot is designed to receive an electronic device with P leads. Therefore, verification upon each connecting cables is a tedious and labor-intensive task.

BRIEF SUMMARY OF THE INVENTION

Embodiments of the present invention are directed to a method for locating wiring swap in a hi-fix structure of a simultaneous multi-electronic device test system which can screen at a full scale and rapidly the complicated wiring status inside the hi-fix structure.

The method for locating wiring swap in a hi-fix structure of a simultaneous multi-electronic device test system is used to investigate the wiring status inside the hi-fix structure and thereby to further pinpoint all the wiring swap thereof. Typically, the hi-fix structure can include at least S socket slots, and each of the socket slots is used to receive an electronic device with at least R leads. According to one aspect of the invention, the method of the present invention comprises following steps.

(1) Prepare R test unit sets. Each of the test unit sets can have S identical lead-off devices. The lead-off device is prepared by cutting a specific lead of the same electronic devices. In addition, every lead-off devices in the same test unit set is designed to have the same lead cut off; i.e., the lead at the same location with respect to the electronic device. Further, any two electronic devices from different test unit sets have different cut-off leads, though the electronic devices are preferable the same.

(2) Mount one of the test unit sets onto the hi-fix structure, by one lead-off device onto a respective socket slot, and then process a predetermined test therewith.

(3) Record test results from the predetermined test.

(4) Determine whether or not all of the test unit sets have been tested with the predetermined test; in case that all of the test unit sets have been tested, process step (5); otherwise, remove the test unit set from the hi-fix structure and process steps (2) to (4) with another test unit set.

(5) Analyze all the test results obtained by step (4) and determine the wiring swap in the hi-fix structure.

In one embodiment of the present invention, the test unit set applied to the method for locating wiring swap in a hi-fix structure of a simultaneous multi-electronic device test system can be decided by following steps.

(1a) Prepare S standard test sets. Each of the standard test sets can have at least R lead-off devices, and every lead-off device in the same standard test set has a different lead cut off, i.e., different cut-off lead.

(1b) Sort or collect the lead-off devices with the same cut-off leads from the standard test units to form R test unit sets, in which each test unit set includes the same lead-off devices.

In some embodiments of the present invention, the test unit set for locating wiring swap in a hi-fix structure of a simultaneous multi-electronic device test system can comprise a plurality of identical lead-off devices, in which the lead-off device is a predetermined electronic device having a plurality of leads and having a specific lead to be cut off.

In one embodiment of the test unit set according to the present invention, the lead-off device can further include a set mark for distinguished the lead-off devices of the other test unit sets. Preferably, the order or number of the cut-off lead can be used as part of the set mark to label the lead-off device of the respective test unit set.

In specific embodiments of the present invention, the standard test set used as a source to form the test unit set can comprise a plurality of different lead-off devices. Each of the lead-off devices has a plurality of leads and has a respective lead to be cut off (i.e., the cut-off lead). Every two of the lead-off devices in the standard test set differ from each other in orders or locations of the cut-off leads.

In one embodiment of the standard test set according to the present invention, the lead-off device can further include a lead-off mark for indicating the location of the cut-off lead. In another embodiment of the standard test set according to the present invention, the lead-off device can further include a set mark for labeling the current standard test set.

In one embodiment, a test kit comprises a plurality of test unit sets each having a plurality of identical lead-off devices, wherein the lead-off devices in each test unit set have identical cut-off leads which are different from the cut-off leads of other test unit sets. In another embodiment, a standard test set kit comprises a plurality of standard test sets each having a plurality of different lead-off devices, wherein each standard test set includes the same plurality of different lead-off devices.

DETAILED DESCRIPTION OF THE INVENTION

Embodiments of the present invention are directed to a method for locating wiring swap in a hi-fix structure of a simultaneous multi-electronic device test system. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

As the prior art described above, it is a labor-intensive and time-consuming job to examine possible wiring swap in the hi-fix structure of the simultaneous multi-electronic device test system. Therefore, the locating method of the present invention utilizes existing automatic testing facilities and sets of sample electronic devices with predetermined cut-off leads to carry out full-scale screening test over the hi-fix structure of test head of the facilities. After obtaining the test results, a specific comparison can then be used to locate all the wiring swap thereof.

Figure 1:
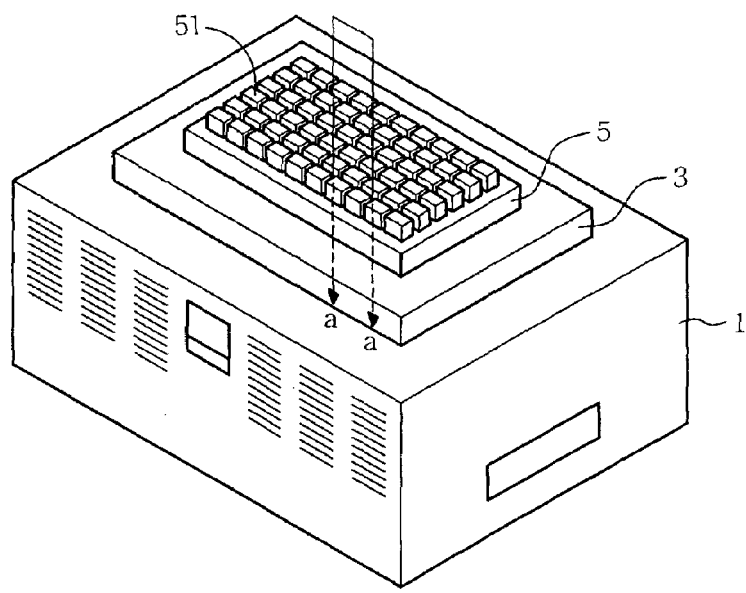
FIG. 1 is a perspective view of a conventional test head of a simultaneous multi-electronic device test system.
Figure 2:
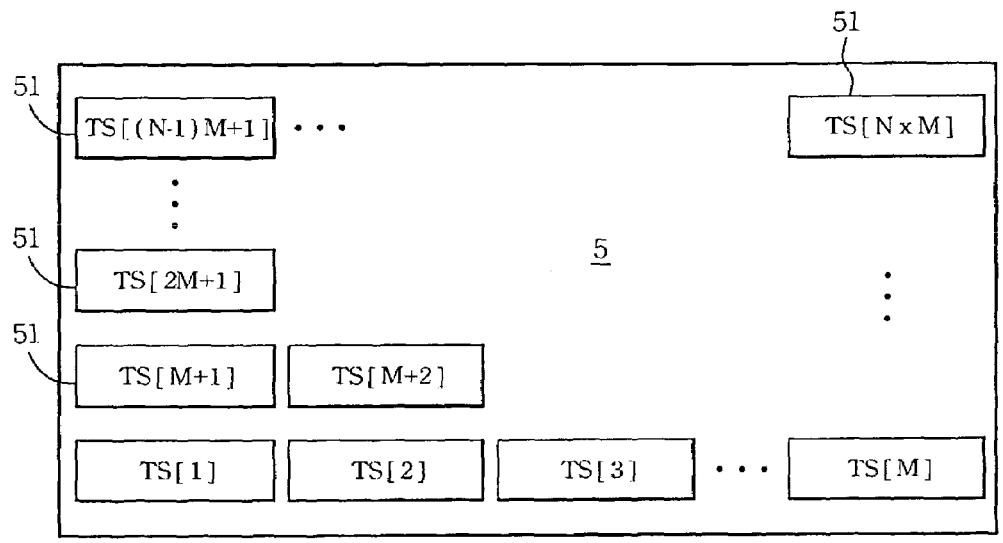
FIG. 2 is a top view of the hi-fix structure of FIG. 1.
Figure 3:
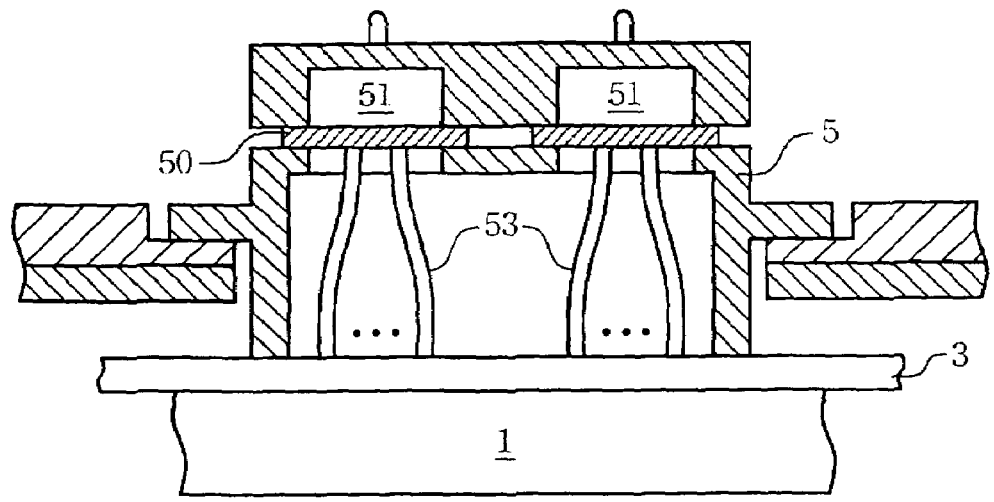
FIG. 3 is a cross-sectional view along line a—a of FIG. 1.
Figure 4:
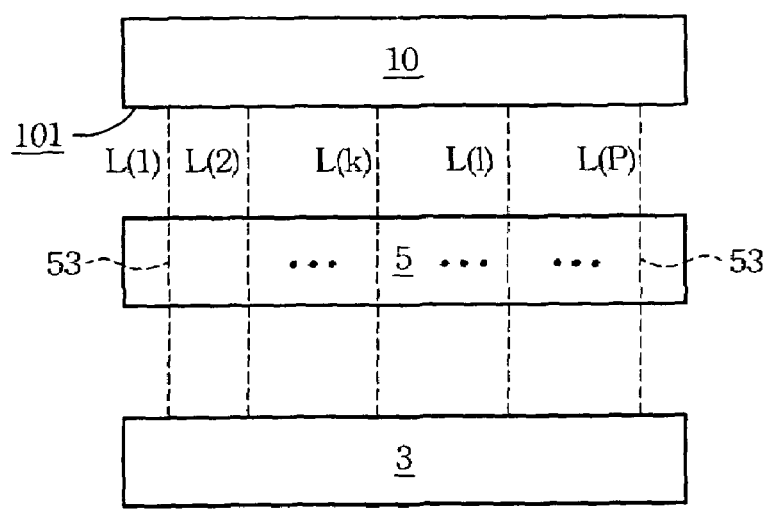
FIG. 4 is a schematic view showing correct wiring of the socket slots in the hi-fix structure.
Figure 5:
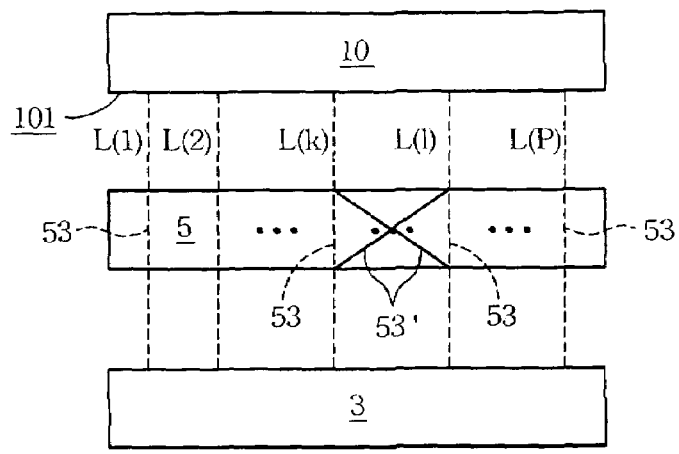
FIG. 5 is a schematic view showing a wiring swap state in wiring of the socket slots in the hi-fix structure.

The hi-fix structure of concern can include at least S socket slots; in particular, $S \leq N \times M$ in the typical hi-fix structure 5 of FIG. 2. Each of the socket slots is used to receive and test an electronic device with at least R leads; in particular, $R \leq P$ in the typical electronic device 10 shown in FIG. 4 or FIG. 5.

Figure 6:
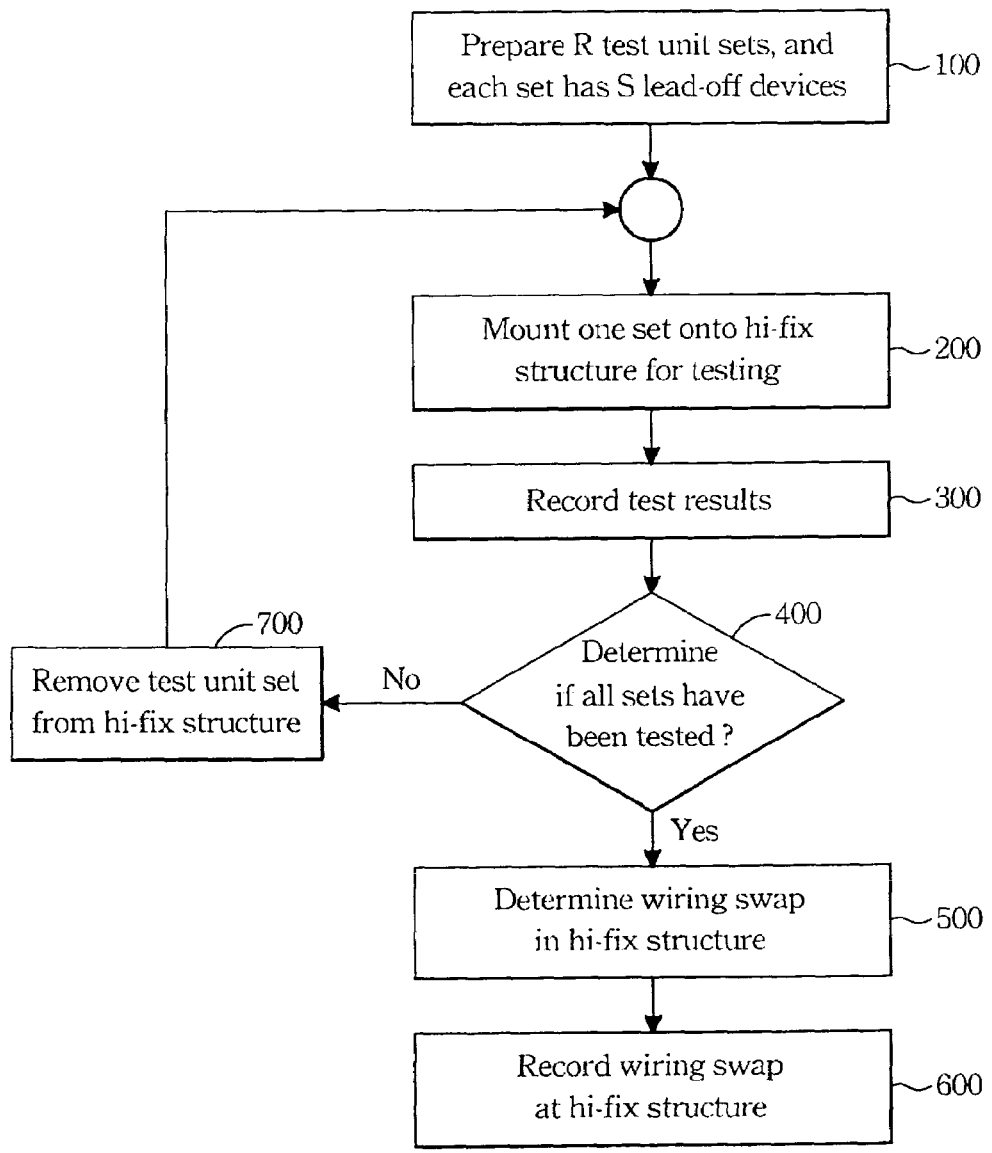
FIG. 6 is a flowchart of a preferred embodiment of the method for locating wiring swap in a hi-fix structure of a simultaneous multi-electronic device test system in accordance with the present invention.

Referring now to FIG. 6, a flowchart of the method for locating wiring swap in a hi-fix structure of a multi-electronic device test system in accordance with an exemplary embodiment of the present invention is shown. The method comprises the following steps.

Step 100: Prepare R test unit sets. Each of the test unit sets can have S identical lead-off devices. The lead-off device is prepared by cutting a specific lead of a predetermined electronic device. In addition, every lead-off device in the same test unit set is designed to have the same lead cut off; i.e., the cut-off lead is at the same location with respect to the electronic device. Further, any two electronic devices from different test unit sets can have different cut-off leads, though the electronic devices are still the same.

Step 200: Mount one of the test unit sets onto the hi-fix structure, by having the lead-off device plugging into a respective socket slot, and then process a predetermined test with the test system having the hi-fix structure.

Step 300: Record test results from the predetermined test.

Step 400: Determine whether or not all of the test unit sets have been tested with the predetermined test. In case that all of the test unit sets have been tested, go to the following step, i.e., step 500. Otherwise, remove the test unit set from the hi-fix structure (Step 700) and then go back to process steps 200 to 400 with another test unit set, till all the test unit sets have been tested over the hi-fix structure.

Step 500: Analyze all the test results obtained in step 300 and then determine the wiring swap in the hi-fix structure.

Step 600: Record all the wiring swap at the hi-fix structure for further maintenance.

In the present invention, the lead-off device for testing is obtained by cutting a specific lead of a predetermined electronic device whose performance is well known. Therefore, the test results upon testing the lead-off devices can be easily used to identify the swapping cables in the hi-fix structure. The judgment of determining the swapping cables by evaluating the test results from testing the given lead-off devices is known to those skilled in the art. Therefore, details will be omitted herein.

In particular, for a hi-fix structure with N×M ($\geq$S) socket slots and each socket slot being used to receive an electronic device with up to P ($\geq$R) leads, the embodiment of the present method of FIG. 6 can still prevail. Nevertheless, in a conservative point of view, full-scale testing upon the hi-fix structure is preferable; i.e., the testing having S=N×M and R=P in FIG. 6.

Figure 7:
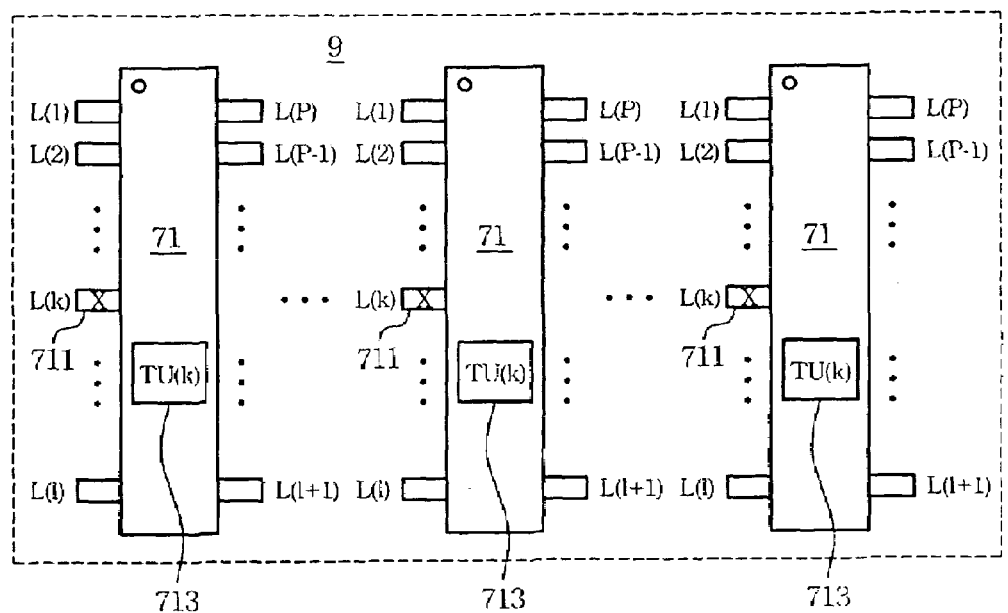
FIG. 7 is a schematic view showing a preferred embodiment of the k-th set of the test unit sets applied to the method for locating wiring swap in a hi-fix structure of a simultaneous multi-electronic device test system in accordance with the present invention.

Referring now to FIG. 7, a typical test unit set 9 in accordance with the present invention is shown. In the test unit set 9, a plurality (at least S) of identical lead-off devices 71 are included and each of the lead-off devices 71 has the same cut-off lead 711, i.e., the L(k) lead.

As shown in FIG. 7, the lead-off device 71 in the test unit set 9 according to the present invention can further include a set mark 713 for indicating the current test unit set; i.e., TU(k) in this typical set 9. The TU(k) set mark 713 can be definitely used to label the cut-off lead 711.

Figure 8:
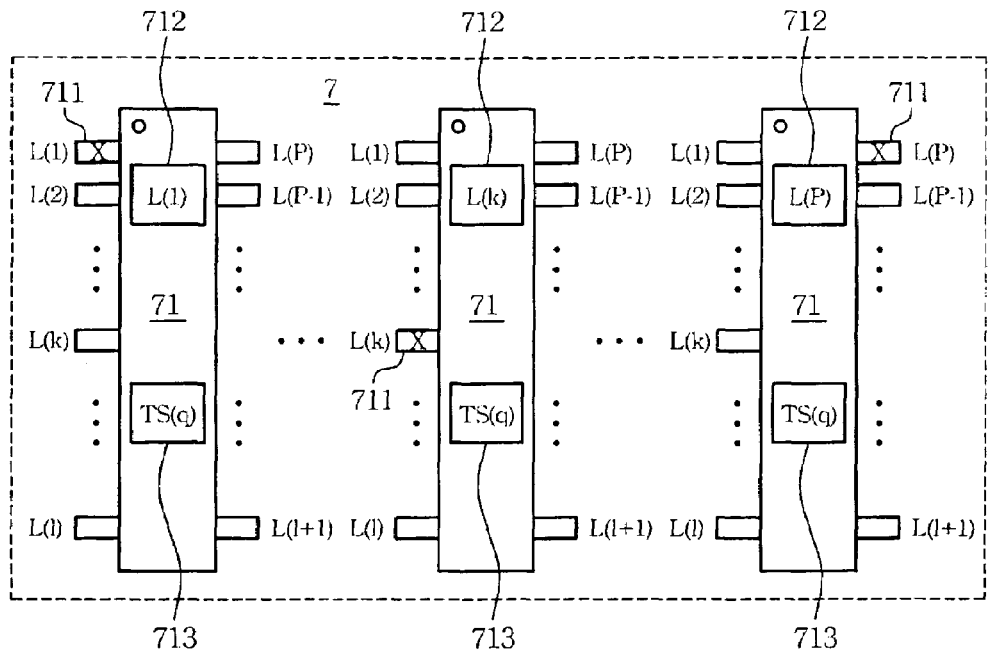
FIG. 8 is a schematic view showing a preferred embodiment of the q-th set of the standard test sets applied to the method for locating wiring swap in a hi-fix structure of a simultaneous multi-electronic device test system in accordance with the present invention.

In the present invention, the preparation of the test unit set 9 can be done by performing a collection from a plurality of identical standard test sets. Referring now to FIG. 8, the standard test set 7 can include a plurality (P as shown) of lead-off devices 71. The lead-off devices 71 are identical but have respective leads to be cut off (i.e., different cut-off leads 711, L(1), L(2), . . . , L(k), . . . , L(1), . . . , and L(P) as shown).

As shown in FIG. 8, the lead-off device 71 of the standard test set 7 can have a lead-off mark 712 for labeling the respective cut-off lead 711; L(1), L(2), . . . , L(k), . . . , L(1), . . . , or L(P) as shown. Similarly, the lead-off device 71 of the standard test set 7 can have a set mark 713 (TS(q) as shown) to label the current set number of the standard test set 7.

In the present invention, compared to the test unit set 9 described above, all of the standard test sets 7 are the same to have all types of lead-off devices; i.e., from L(1) to L(P) for example. Therefore, the standard test sets 7 can be convenient to be used for preparing any combination of the test unit sets 9.

Figure 9:
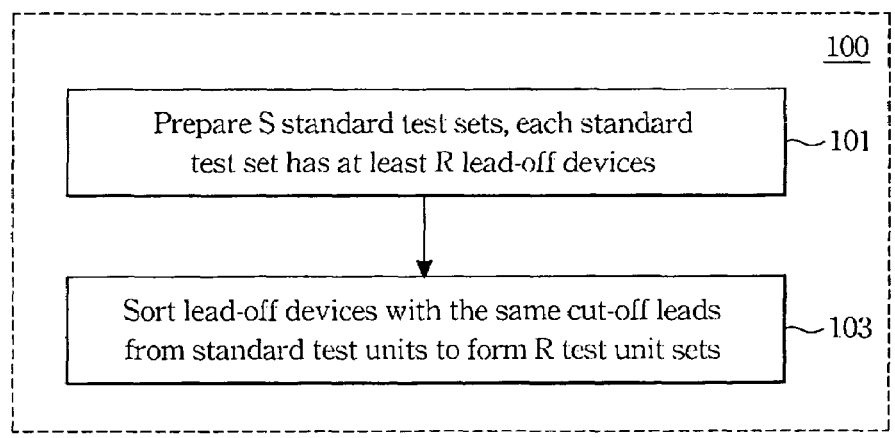
FIG. 9 is a preferred flowchart of step 100 of FIG. 6.

Referring now to FIG. 9, the preparation of the test unit sets 9 (Step 100 of FIG. 6) from sorting the standard test sets 7 can have the following steps.

Step 101: Prepare S standard test sets. Each of the standard test sets can have at least R lead-off devices, and every lead-off device in the same standard test set has a different lead cut off; i.e., different cut-off lead.

Step 103: Sort or collect the lead-off devices with the same cut-off leads from the standard test units to form R test unit sets, in which each test unit set includes the same lead-off devices.

In the present invention as described above, a useful result of every testing upon the hi-fix structure with the test unit set can be obtained because of the cut-off leads and the predetermined electronic devices. Furthermore, the preferred method shown in FIG. 6 which screens all cables in the hi-fix structure related to all the R leads is a conservative examination. In particular, in case that an electronic device to be tested has part of leads totally non-related in function and connection to other leads (usually seen in a multi-chip module), the lead-off device of the test unit set or the standard test set can then have more than one lead to be cut. Significantly, those leads to be cut in the same electronic devices should be independent of each other in function and connection. Upon such an arrangement, the comparison and judgment to determine the wiring swap through the results obtained by the present invention can still prevail, and also the number of the lead-off devices needed for testing of the present invention can be reduced.

In the present invention, timings for performing the locating method of the present invention can be the arrival time of the test system, the time of periodical maintenance upon the test system, or any time that needs an extra survey upon the connection cables in the hi-fix structure.

By providing the method for locating wiring swap in a hi-fix structure of a simultaneous multi-electronic device test system described above, the status of connection cables inside the hi-fix structure can be rapidly and full-scale investigated. Therefore, the labor for maintenance and shutdown time of the test system can be greatly saved.

While the present invention has been particularly shown and described with reference to a preferred embodiment, it will be understood by those skilled in the art that various changes in form and detail may be without departing from the spirit and scope of the present invention.

What is claimed is:

1. A method for locating wiring swap in a hi-fix structure of a simultaneous multi-electronic device test system, the hi-fix structure including at least S socket slots, each of the socket slots configured to receive a device with at least R leads, S being a natural number and R being a natural number, the method comprising:

preparing R test unit sets, each of the test unit sets having S identical lead-off devices, each of the lead-off devices in the same test unit set having a specific lead cut off which is different from leads cut off in other test unit sets;

connecting one of the test unit sets onto the hi-fix structure and processing a predetermined test therewith, one test unit set at a time, until all of the R test unit sets are processed;

recording test results from the tests of the R test unit sets; and analyzing all the test results of the R test unit sets and determining the wiring swap in the hi-fix structure.

2. The method for locating wiring swap in a hi-fix structure of a simultaneous multi-electronic device test system according to claim 1, wherein each said lead-off device of the R test unit sets includes a set mark to label a set number of the test unit set.

3. The method for locating wiring swap in a hi-fix structure of a simultaneous multi-electronic device test system according to claim 1, further comprising:
    preparing S standard test sets, each of said S standard test sets having at least R lead-off devices, each of said lead-off devices in the same standard test set having a different lead cut off; and
    sorting identical lead-off devices having same lead cut off from said standard test units to form said R test unit sets.

4. The method for locating wiring swap in a hi-fix structure of a simultaneous multi-electronic device test system according to claim 3, wherein each said lead-off device in said S standard test sets includes a lead-off mark to indicate a location of the cut-off lead.

5. The method for locating wiring swap in a hi-fix structure of a simultaneous multi-electronic device test system according to claim 3, wherein each said lead-off device in said S standard test sets includes a set mark to label a set number of the S standard test set.

6. The method for locating wiring swap in a hi-fix structure of a simultaneous multi-electronic device test system according to claim 1, wherein each said lead-off device in said R test unit sets includes a lead-off mark to indicate a location of the cut-off lead.

7. A method for locating wiring swap in a hi-fix structure of a simultaneous multi-electronic device test system, the hi-fix structure including at least S socket slots, each of the socket slots configured to receive a device with at least R leads, S being a natural number and R being a natural number, the method comprising:
    preparing R test unit sets, each of the test unit sets having S identical lead-off devices, each of the lead-off devices in the same test unit set having a specific lead cut off which is different from leads cut off in other test unit sets;
    connecting one of the test unit sets onto the hi-fix structure and processing a predetermined test therewith, one test unit set at a time; and
    based on test results from the tests of the R test unit sets, determining the wiring swap in the hi-fix structure.

8. The method for locating wiring swap in a hi-fix structure of a simultaneous multi-electronic device test system according to claim 7, wherein each said lead-off device of the R test unit sets includes a set mark to label a set number of the test unit set.

9. The method for locating wiring swap in a hi-fix structure of a simultaneous multi-electronic device test system according to claim 7, further comprising:
    preparing S standard test sets, each of said S standard test sets having at least R lead-off devices, each of said lead-off devices in the same standard test set having a different lead cut off; and
    sorting identical lead-off devices having same lead cut off from said standard test units to form said R test unit sets.

10. The method for locating wiring swap in a hi-fix structure of a simultaneous multi-electronic device test system according to claim 9, wherein each said lead-off device in said S standard test sets includes a lead-off mark to indicate a location of the cut-off lead.

11. The method for locating wiring swap in a hi-fix structure of a simultaneous multi-electronic device test system according to claim 9, wherein each said lead-off device in said S standard test sets includes a set mark to label a set number of the S standard test set.

12. The method for locating wiring swap in a hi-fix structure of a simultaneous multi-electronic device test system according to claim 7, wherein each said lead-off device in said R test unit sets includes a lead-off mark to indicate a location of the cut-off lead.

* * * * *